(12) United States Patent
Huang et al.

(10) Patent No.: US 8,023,363 B2
(45) Date of Patent: Sep. 20, 2011

(54) TIME-TO-DIGITAL CONVERTER APPARATUS

(75) Inventors: Hong-Yi Huang, Taipei (TW); Yi-Jui Tsai, Taipei (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 597 days.

(21) Appl. No.: 12/113,955

(22) Filed: May 2, 2008

(65) Prior Publication Data

US 2009/0141595 A1 Jun. 4, 2009

(30) Foreign Application Priority Data

Dec. 4, 2007 (TW) ................................ 96146133 A

(51) Int. Cl.
*G04F 8/00* (2006.01)
*H03M 1/12* (2006.01)
(52) U.S. Cl. .......................... 368/118; 368/120; 341/155
(58) Field of Classification Search .................. 368/113, 368/118–121; 341/155–157, 166, 167
See application file for complete search history.

(56) References Cited

U.S. PATENT DOCUMENTS

| | | | | |
|---|---|---|---|---|
| 5,835,552 | A * | 11/1998 | Kusumoto et al. | 377/24 |
| 7,522,084 | B2 * | 4/2009 | Huang et al. | 341/157 |
| 7,782,104 | B2 * | 8/2010 | Madoglio et al. | 327/158 |
| 2002/0131538 | A1 * | 9/2002 | Staszewski et al. | 375/355 |
| 2005/0057312 | A1 * | 3/2005 | Chang et al. | 331/16 |
| 2006/0038711 | A1 * | 2/2006 | Chou et al. | 341/155 |
| 2008/0246522 | A1 * | 10/2008 | Kossel et al. | 327/159 |
| 2009/0153377 | A1 * | 6/2009 | Chang | 341/53 |
| 2009/0303091 | A1 * | 12/2009 | Rivior | 341/120 |
| 2009/0322574 | A1 * | 12/2009 | Rivoir | 341/120 |

OTHER PUBLICATIONS

Article titled "A Wide-Range, High-Resolution, Compact, CMOS Time to Digital Converter" authored by Ramakrishnan et al., Proceedings of the 19th International Conference on VLSI Design (VLSID' 06).
Article titled "A High-Precision Time-to-Digital Converter Using a Two-Level Conversion Scheme" authored by Hwang, et al., IEEE Transactions on Nuclear Science, vol. 51, No. 4, Aug. 2004.

* cited by examiner

*Primary Examiner* — Vit W Miska
(74) *Attorney, Agent, or Firm* — Jianq Chyun IP Office

(57) ABSTRACT

A time-to-digital converter apparatus including a delay phase-locked loop, a subtracter, a multi-phase detector and a Vernier detector is disclosed. The delay phase-locked loop herein includes digital delay components for producing counting signals. The multi-phase detector includes digital delay components for producing delay outputs according to the counting signals and thereby detecting a pulse input signal. The Vernier detector includes digital delay components for detecting the remainder of the pulse input signal according to the difference between the delay outputs produced by the subtracter.

14 Claims, 13 Drawing Sheets

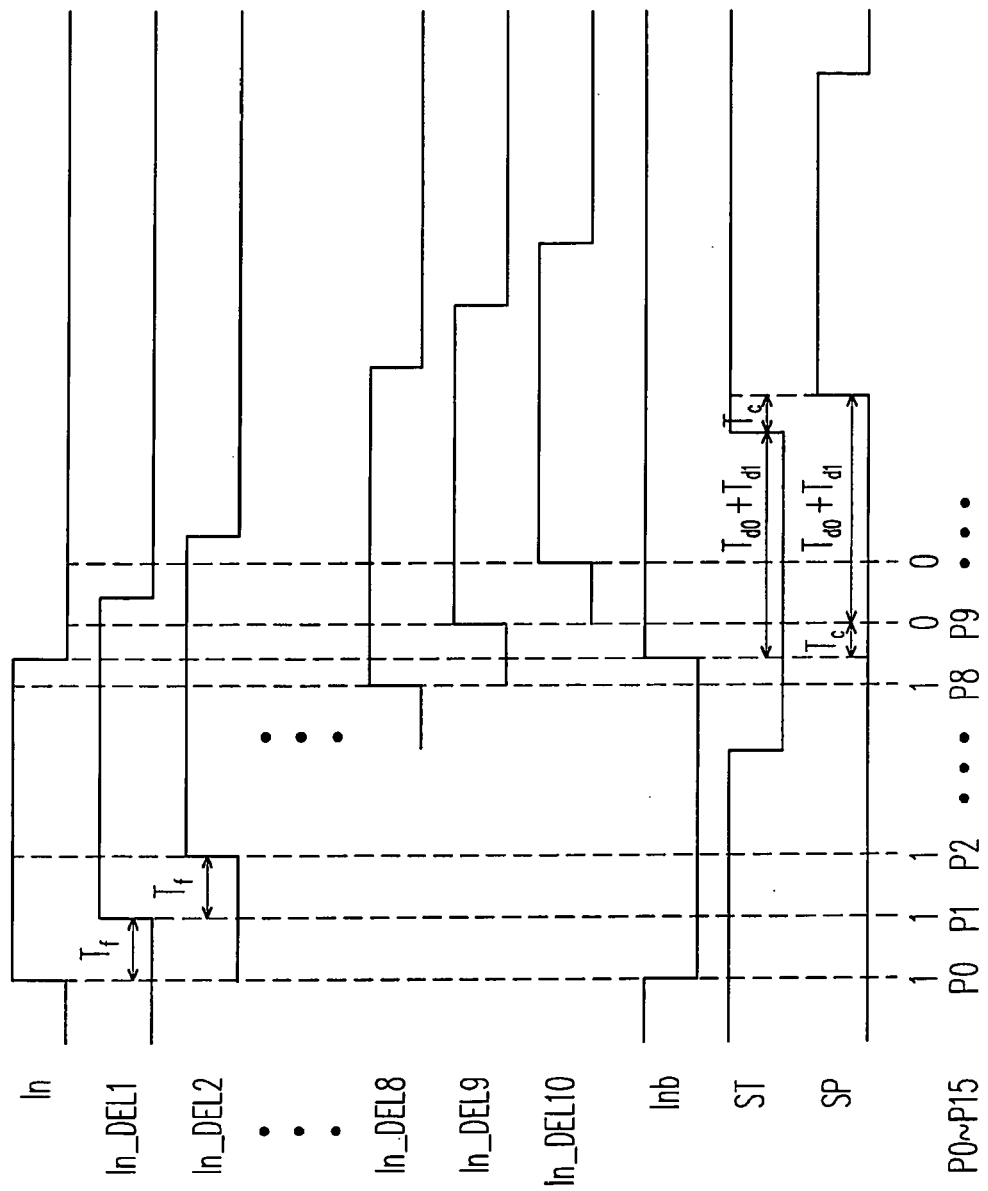

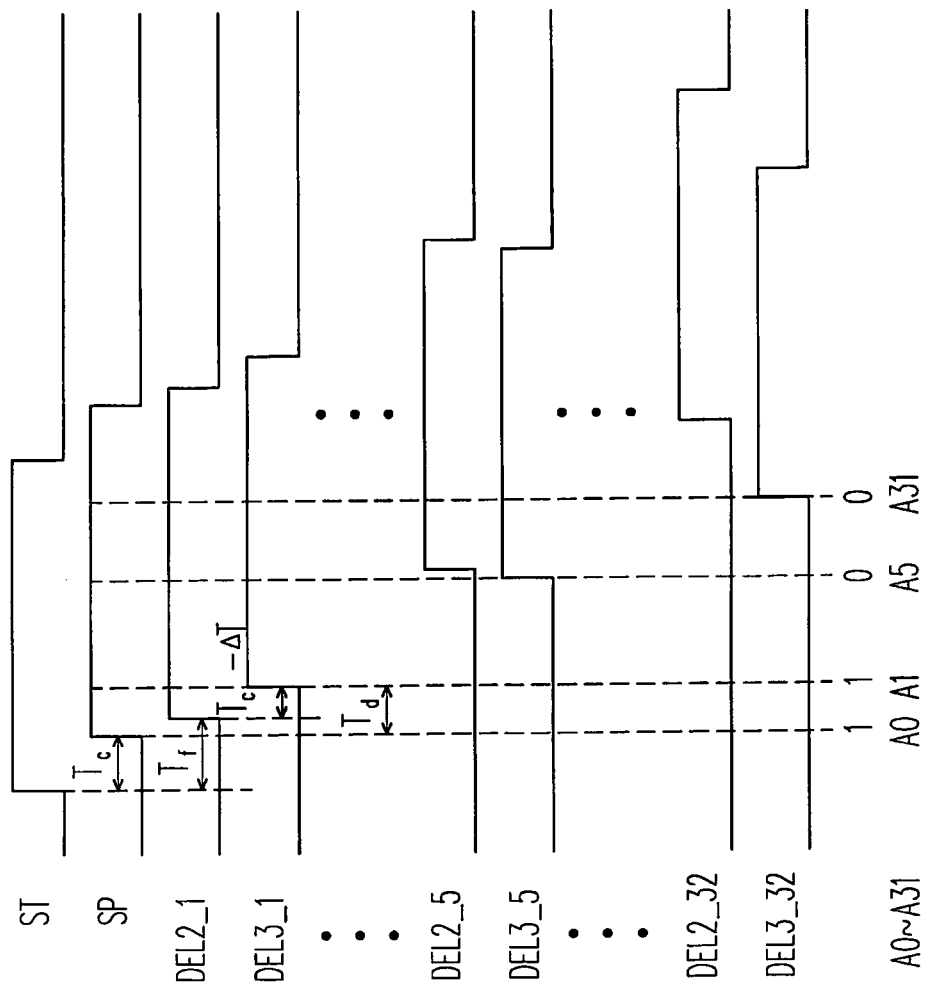

TIME-TO-DIGITAL CONVERTER APPARATUS

CROSS-REFERENCE TO RELATED APPLICATION

This application claims the priority benefit of Taiwan application serial no. 96146133, filed on Dec. 4, 2007. The entirety of the above-mentioned patent application is hereby incorporated by reference herein and made a part of this specification.

BACKGROUND OF THE INVENTION

1. Field of the Invention

The present invention generally relates to a converter apparatus (TDC apparatus), and more particularly, to a time-to-digital converter apparatus.

2. Description of Related Art

Thanks for the success and the development of integrated circuit (IC), a number of troublesome jobs to be done in the past can be fulfilled by using ICs today, wherein the job of measuring time is a good example. In the past, in order to accurately measure time length, people worried out to conceive and design few equipments. The time was effectively measured by using the equipments in association with appropriate algorithms. The conventional approach to measure time has the disadvantages of low measurement accuracy and high cost. In particular, the conventional approaches are not competent for measuring time in high speed (for example, an nano-second level measurement is required).

FIG. 1 is a diagram of a conventional TDC apparatus. Referring to FIG. 1, the TDC apparatus is for detecting the pulse-width in low-level of a pulse input signal T1, wherein a transistor BT1 and another transistor BT2 respectively receive and detect the pulse input signal T1 and the inverted signal T2 of the pulse input signal T1. When the pulse input signal T2 takes a low-level, the switch SW is enabled, and meanwhile a capacitor CA1 is pre-charged; when the pulse input signal T2 takes a high-level, the transistor BT2 is turned on and the switch SW is disabled, and meanwhile a current source I1 makes the capacitor CA1 discharged. The discharging voltage is transmitted to an analog-to-digital converter (ADC) 120 through a buffer 110 to produce a digital signal OUT, so that the digital value corresponding to the low-level pulse-width of the pulse input signal T1 is obtained.

FIG. 2 is a diagram of a conventional bi-slope TDC apparatus. The TDC apparatus in FIG. 2 employs two TDC apparatuses of FIG. 1 and has two input terminals for respectively receiving and detecting the pulse input signal T1 and the opposite pulse input signal T2, wherein the capacitor C2 has a greater capacitance than that of the capacitor C1, and the current source I2 is less than the current source I1. In the prior art, the output voltage V1 has a different discharging slope from that of the output voltage V2, and a comparator COMP1 is used to compare the two discharging slopes. Further, an AND-gate AN1 and a counter 201 are used so as to convert the comparison result into the digital signal OUT in association with a clock signal SCLK.

FIG. 3 is a diagram of a conventional TDC apparatus with a two-level time detect circuit (TDC). The circuit architecture is presented by the IEEE (Institute of Electrical and Electronic Engineers) paper "*A High-Precision Time-to-Digital Converter Using a Two-level Conversion Scheme*", the Nuclear Science Periodic Vol. 51, No. 4 in August 2004.

The conventional circuit architecture herein employs a multi-phase detector 310 and the delay value $V_{BNF}$ produced by the double delay phase-locked loop 330 to detect and determine whether the integer multiple P is the pulse input signal Input over the delay value $V_{BNF}$. The Vernier detector 320 is used to detect the remainder Input1 of the pulse input signal after dividing the pulse input signal Input by the delay value. The Vernier detector 320 also uses the difference between another delay value $V_{BNS}$ produced by the double delay phase-locked loop 330 and the delay value $V_{BNF}$ to detect the remainder Input1 of the pulse input signal so as to obtain the relation of the integer multiple V of the remainder Input1 of the pulse input signal over the difference between the delay value $V_{BNF}$ and the delay value $V_{BNS}$.

SUMMARY OF THE INVENTION

Accordingly, the exemplary invention is directed to a TDC apparatus for detecting the pulse-width of the pulse input signal and converting the pulse-width into a digital signal.

The exemplary invention provides a TDC apparatus, which includes a delay phase-locked loop (DPLL), a subtracter, a multi-phase detector and a Vernier detector, wherein the DPLL has an input terminal and an output terminal, and the input terminal is employed for receiving an input clock signal and the output terminal is employed to transmit a first counting signal; the subtracter has an output terminal, a first input terminal and a second input terminal, and the first input terminal receives the first counting signal, the second input terminal receives a second counting signal and the output terminal produces a third counting signal, wherein the third counting signal is the difference between the first counting signal and the second counting signal.

Since the exemplary invention employs the delay components formed by a digital circuit rather than the prior art where the delay components are composed of capacitors and resistors, therefore, the delay components of the present invention have better linearity, which results in accurate conversion result. In addition, the digital delay component is advantageous in high speed and small circuit area, which results in low cost and fast response speed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5B is a diagram illustrating the input signals and the output signals of the multi-phase detector in FIG. 5A.

FIG. 6B is a diagram illustrating the input signals and the output signals of the Vernier detector in FIG. 6A.

DESCRIPTION OF THE EMBODIMENTS

Figure 1:
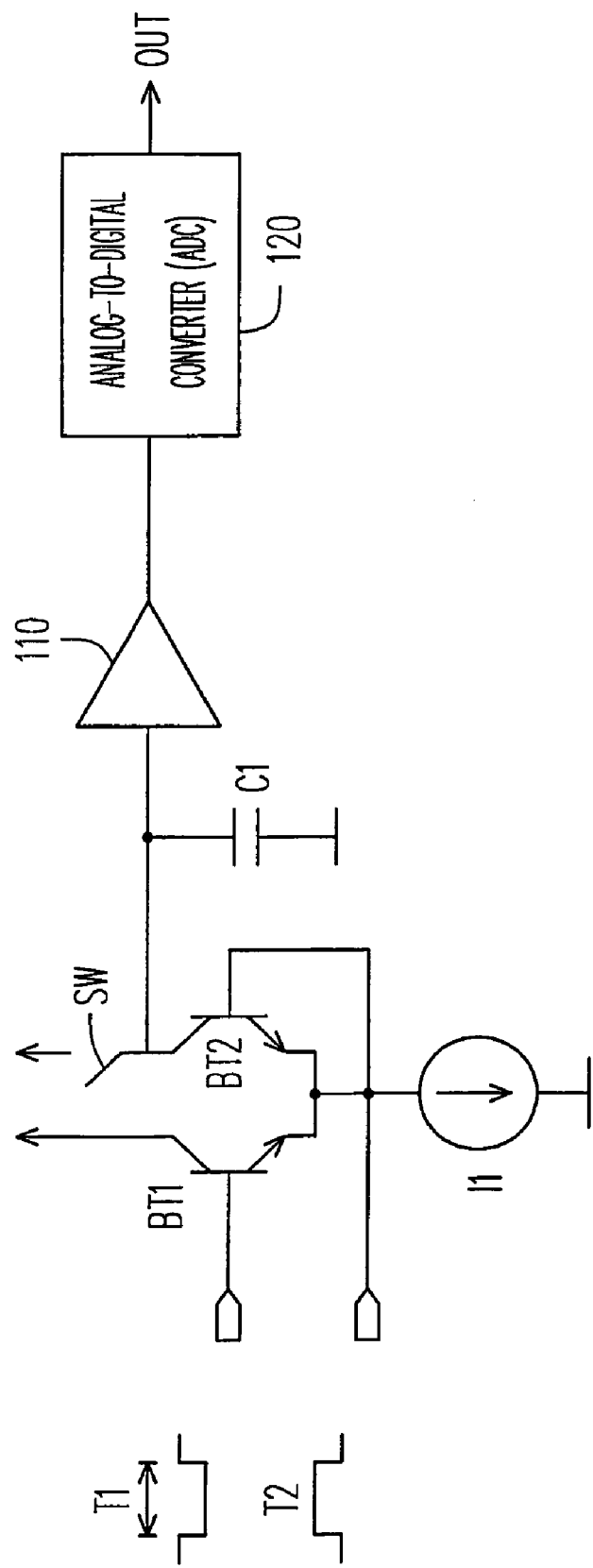
FIGS. 1-3 are diagrams of conventional TDC apparatuses.
Figure 2:
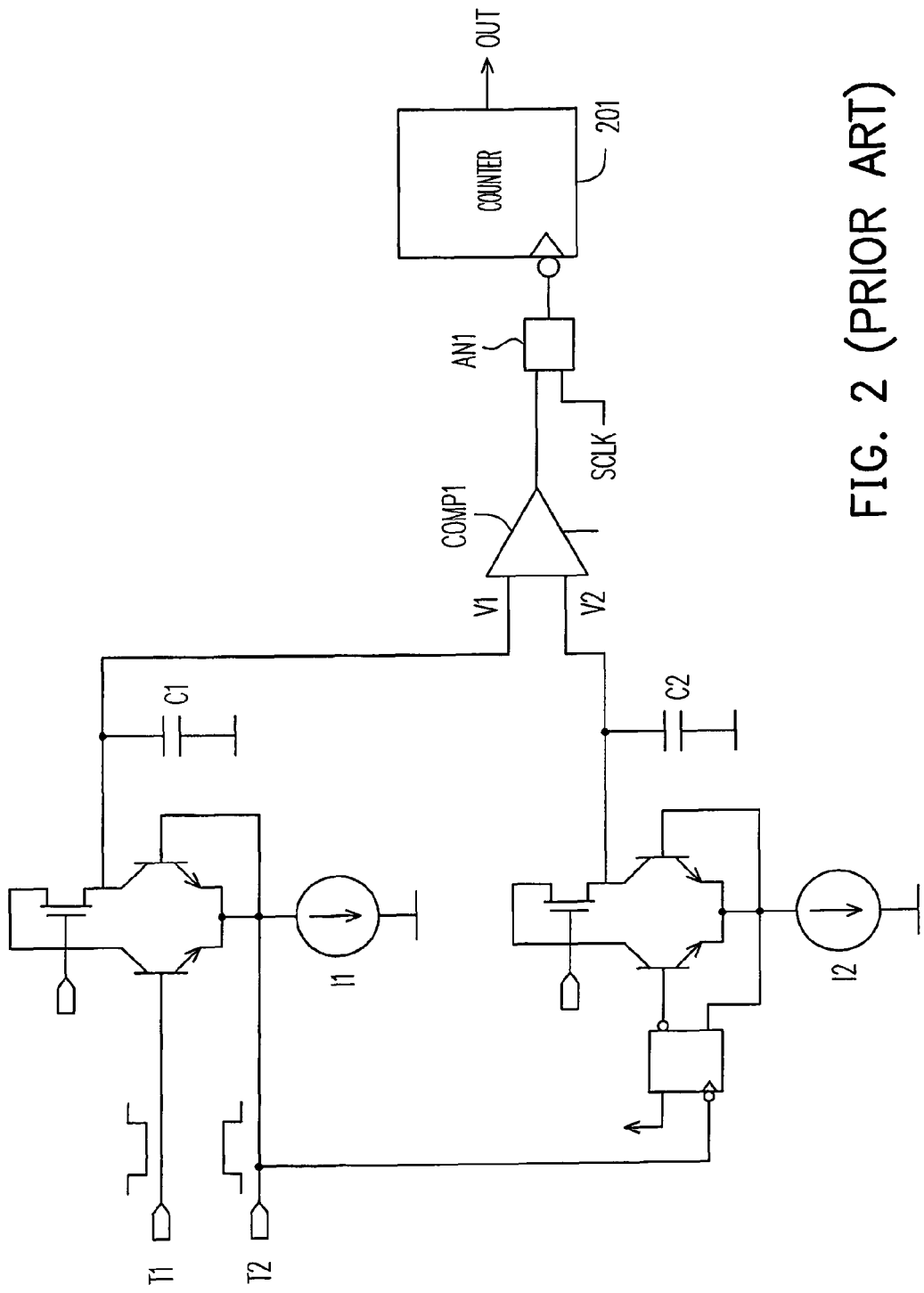
Figure 3:
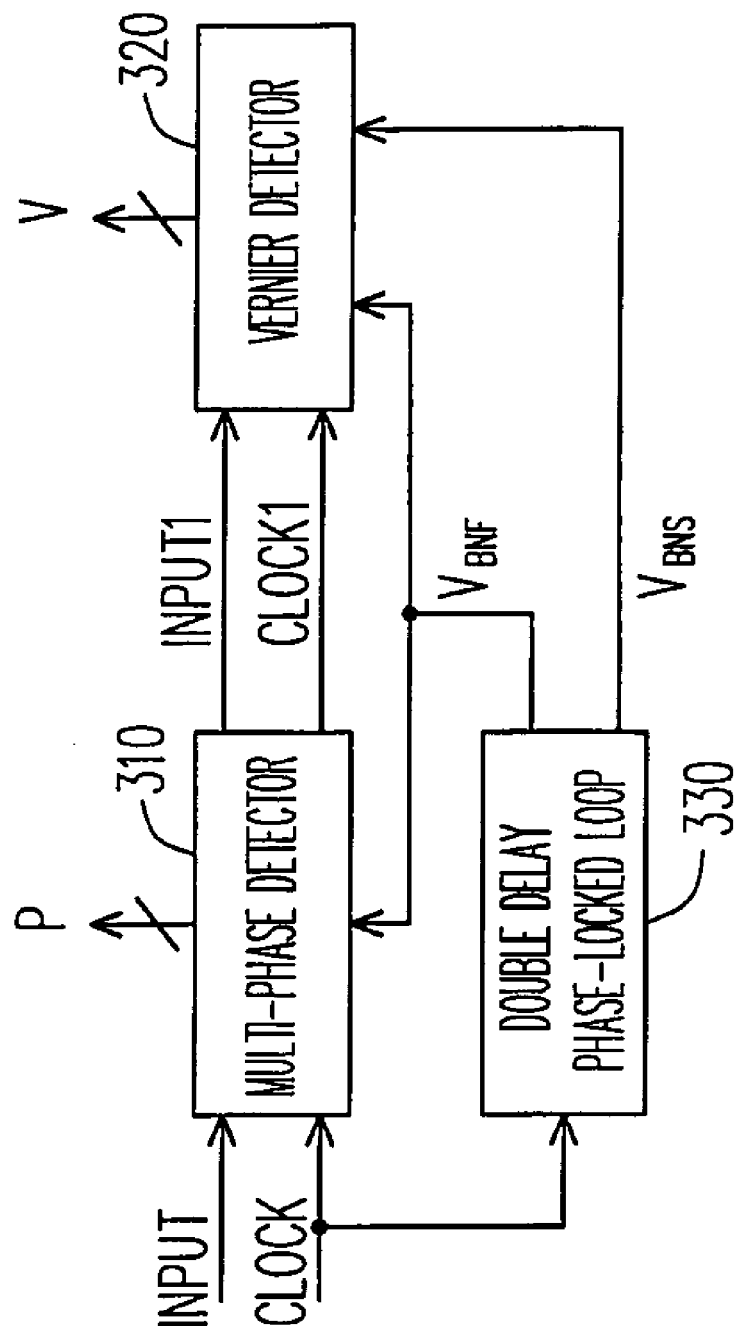

Reference will now be made in detail to the present preferred embodiments of the invention, examples of which are illustrated in the accompanying drawings. Wherever possible, the same reference numbers are used in the drawings and the description to refer to the same or like parts.

Figure 4:
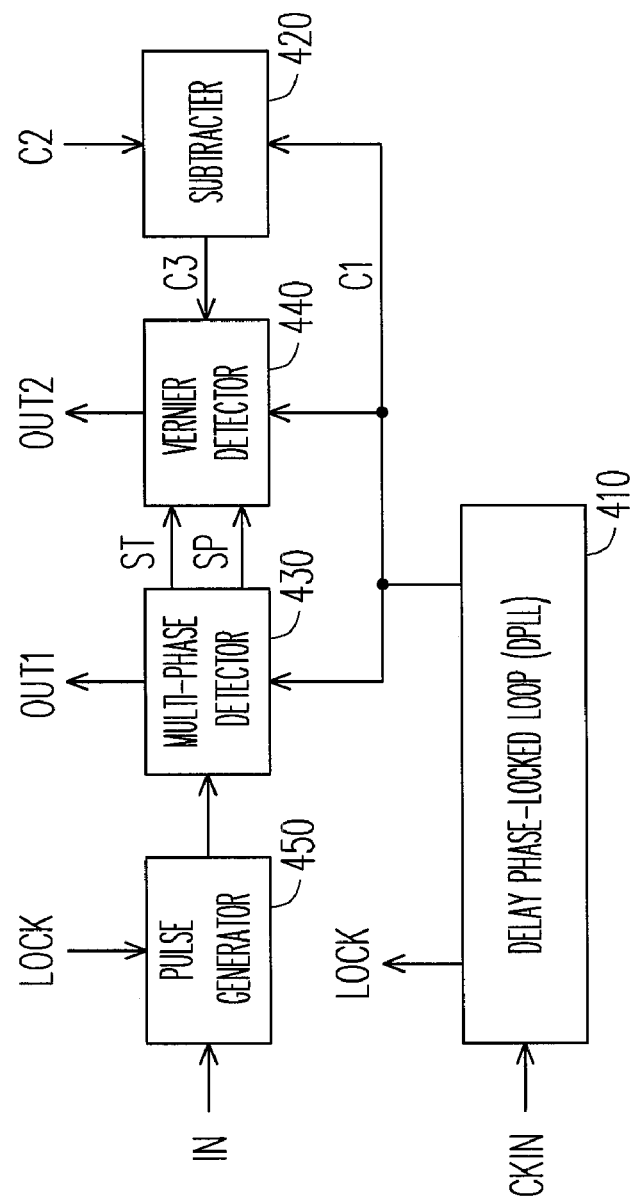
FIG. 4 is a block diagram of a TDC apparatus according to an embodiment of the present invention.

FIG. 4 is a block diagram of a TDC apparatus according to an exemplary embodiment of the present invention. Referring to FIG. 4, the TDC apparatus of the embodiment includes a DPLL 410, a subtracter 420, a multi-phase detector 430 and a Vernier detector 440, wherein the DPLL 410 has an input terminal and an output terminal, the input terminal is employed for receiving an clock signal CKIN and the output terminal is employed to transmit a counting signal C1; the subtracter 420 has an output terminal, a first input terminal and a second input terminal, the first input terminal is employed for receiving the counting signal C1, the second input terminal is employed for receiving a counting signal C2 and the output terminal is employed to produce a counting signal C3.

The TDC apparatus of the exemplary embodiment further includes a pulse generator 450 coupled between an pulse input signal IN and the multi-phase detector 430. The pulse generator 450 has an input terminal, an output terminal and an enabling terminal, wherein the input terminal receives the pulse input signal IN and the enabling terminal is employed for receiving a locking signal LOCK. When the locking signal LOCK is enabled, the pulse generator 450 directly sends the pulse input signal IN to the output terminal thereof; when the locking signal LOCK is disabled, the output terminal outputs a ground voltage. The pulse generator 450 functions to decide whether or not the pulse input signal IN is sent into the TDC apparatus so as to avoid the circuit from a fault action.

The multi-phase detector 430 has a pulse input terminal, a time signal input terminal, a starting signal output terminal, a stopping signal output terminal and an output terminal, wherein the input terminal receives the pulse input signal IN, the time signal input terminal receives the counting signal C1, the starting signal output terminal produces a starting signal ST, the stopping signal output terminal produces a stopping signal SP and the output terminal produces an output signal OUT1. The Vernier detector 440 has a starting signal input terminal, a stopping signal input terminal, a first counting signal input terminal, a second counting signal input terminal and an output terminal, wherein the starting signal input terminal receives the starting signal ST, the stopping signal input terminal receives the stopping signal SP, the first counting signal input terminal receives the counting signal C1 and the second counting signal input terminal receives the counting signal C3.

The DPLL 410 also includes a plurality of delay components formed by digital circuits. The delay values produced by the delay components are determined by the counting signal C1. The DPLL 410 adjusts the counting signals C1 and further adjusts the total delay value produced by the above-mentioned delay components according to the period of the input clock signal CKIN. At the time, the delay time of each delay component would take the same share of the period of the clock signal CKIN and the summation of all the shares is equal to the period. After adjusting the total delay value, the counter in the DPLL 410 stops counting, which means the amount of the counting signal C1 is locked and the locking signal LOCK is converted into logic-1.

The subtracter 420 is for subtracting the counting signal C2 from the counting signal C1 to obtain the result of the counting signal C3, wherein the counting signal C2 is available for a user to enter. When the user changes the counting signal C2 by entering, the counting signal C3 is accordingly changed as well, so that the user is able to desirably adjust the detection resolution in the Vernier detector 440 at any time. The circuit operation in this regard would be explained in the following by referring to the Vernier detector 440 and the operation thereof.

The multi-phase detector 430 includes a plurality of delay components as well and the delay components are formed by digital circuits. Similarly, the delay values produced by the delay components are determined by the counting signal C1. The multi-phase detector 430 utilizes the delayed pulse input signal IN to detect and determine the integer multiple relationship between the pulse-width of the pulse input signal IN and the delay value produced by each delay component. For example, the pulse-width of the pulse input signal IN is between the multiple N and the multiple N+1 of the delay value (N is a positive integer). Thus, the integer multiple portion of the pulse input signal IN is coded into a digital output signal OUT1 (the larger portion of the pulse input signal IN), and the smaller portion, i.e. the remainder portion less than the delay value, is represented by the phase difference between the starting signal ST and the stopping signal SP. The phase difference is output to the starting signal output terminal and the stopping signal output terminal. Note that the number of the delay components must be greater than or equal to (N+1).

The Vernier detector 440 is employed for detecting the remainder portion less than the delay value. The Vernier detector 440 includes two sets of delay components, and all of the delay components are formed by digital circuits. The delay value produced by one of the two sets of delay components is controlled by the counting signal C1, while the delay value produced by the delay circuit of another set is controlled by the counting signal C3. The Vernier detector 440 uses the difference between the two delay values to detect the phase difference between the starting signal ST and the stopping signal SP. For example, the detected phase difference between the starting signal ST and the stopping signal SP is between M times and (M+1) times of the difference between the above-mentioned two delay values; thus, the number of the delay components of the any set in the Vernier detector 440 must be greater than or equal to N+1. Then, M is coded into a digital output signal OUT2. By using the output signal OUT2 as a low-bit set and using the output signal OUT1 as a high-bit set to form a binary number, the digital expression of the pulse input signal IN is obtained.

In fact, the counting signal C2 mentioned in the depiction of the subtracter 420 is equal to the difference between the counting signals C1 and C3; therefore, the difference between the above-mentioned two delay values can be controlled by controlling the counting signal C2 so as to adjust the detection resolution of the Vernier detector 440.

Figure 5A:
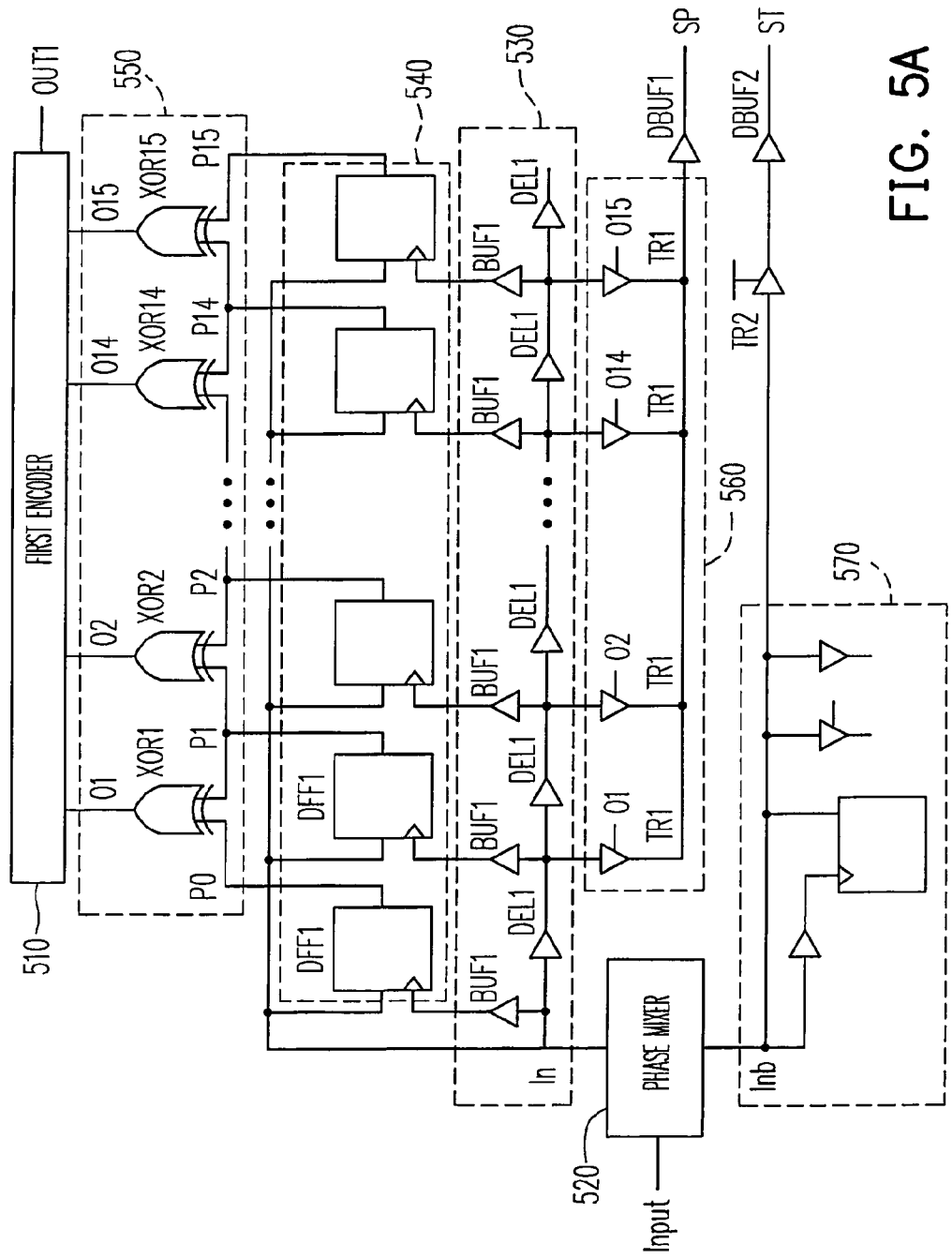
FIG. 5A is a diagram showing an implementation of a multi-phase detector according to an embodiment of the present invention.

FIG. 5A is a diagram showing an implementation of a multi-phase detector according to an embodiment of the present invention. Referring to FIG. 5A, a multi-phase detector includes a first encoder 510, a phase mixer 520, a first delay chain 530, a first register module 540, a first comparison module 550, a first switch module 560 and a second switch unit TR2.

The phase mixer 520 has an input terminal, a first output terminal and a second output terminal, wherein the input terminal receives the pulse input signal Input, the first output terminal outputs a first output pulse signal In and the second output terminal outputs a second output pulse signal Inb, and the second output pulse signal Inb is the inverted first output pulse signal. The input terminal of the first delay chain 530 is coupled to the first output pulse signal In. In the embodiment, the first delay chain 530 includes 16 delay components DEL1 connected in series to each other, which produce 15 first delay outputs (the last one of the 16 delay components is out of duty due to no following delay component as a load). The first register module 540 includes 16 registers DFF1, the 16 clock input terminals thereof respectively receive the above-mentioned 16 first delay outputs, the 16 data input terminals receive the first pulse signal In and the 16 output terminals thereof output 16 sampling results P0-P15.

The first comparison module 550 includes 15 comparators XOR1-XOR15 and each of the comparators XOR1-XOR15 sequentially receives two results among the 16 sampling results. For example, the first comparator XOR1 receives the sampling results P0 and P1, the next comparator XOR2 receives the sampling results P1 and P2 and analogically for the rest. The comparators XOR1-XOR15 sequentially produce 15 comparison results O1-O15. The first encoder 510 receives the comparison results O1-O15 and codes them into a digital output signal OUT1. The first switch module 560 includes 15 witch unit TR1, which respectively receive the first delay output, are respectively disabled or enabled according to the corresponding comparison results and output a stopping signal SP to the common output terminal thereof. In addition, the input terminals of the above-mentioned switch unit TR2 receive a second output pulse signal Inb, the output terminals thereof produce a starting signal ST and the enabling terminal is coupled to a first voltage for permanently enabling the switch unit TR2. In the embodiment, the first voltage is the system voltage.

FIG. 5B is a diagram illustrating the input signals and the output signals of the multi-phase detector in FIG. 5A. In terms of the operation of the multi-phase detector 430 referring to FIG. 5B, after the first output pulse signal In is delayed by the first delay chain 530, a plurality of first delay outputs In_DEL1-In_DEL16 are produced, wherein every stage has a same delay time $T_f$, wherein the delay time $T_f$ is controlled by the counting signal C1. The first register module 540 uses the first delay outputs In_DEL1-In_DEL16 for sequentially sampling the first output pulse signal In. When the sampling result is '1', it means the pulse-width of the first output pulse signal In is greater than the corresponding total delay time; in other words, if the sampling result P1 is equal to '1', the pulse-width of the first output pulse signal In is greater than a delay time of $2T_f$. In contrast, when the sampling result is '0', it means the pulse-width of the first output pulse signal In is less than the corresponding total delay time; in other words, if the sampling result P8 is equal to '0', the pulse-width of the first output pulse signal In is less than a delay time of $8T_f$. In FIG. 5B, the sampling result P8 is equal to 1 and the sampling result P9 is equal to 0, which means the pulse-width of the first output pulse signal In is between $8T_f$ and $9T_f$.

Continuing to refer FIG. 5B, it can be seen that only one among the sampling results P0-P15 corresponds to the transition point from '1' to '0'. The first comparison module 550 uses the comparators XOR1-XOR15 (they are implemented by MUTEX-OR gates in the embodiment) to determine the transition point from '1' to '0'. In fact, the comparison results O1-O15 are intended to output the transition point from '1' to '0', wherein only one among the comparison results O1-O15 is the signal '1', and it can be deducted from FIG. 5B that the comparison result O9 would be equal to '1'. The comparison results O1-O15 also serves as the enabling signals of the switch components TR1. Thus, only one of the switch components TR1 is turned on. The output terminal of the first switch module 560 outputs the first delay output corresponding to the enabled switch unit, and the first delay output serves as the stopping signal SP.

It can be seen from the waveform diagram that the stopping signal SP is equal to the first delay output In_DEL9 delayed by a gate delay $T_{d0}$, wherein the gate delay $T_{d0}$ is caused by the switch unit TR1. The starting signal ST makes the second output pulse signal Inb delay by the gate delay $T_{d0}$ caused by the switch unit TR2 (since the switch units TR1 and TR2 have the same circuit architecture). The multi-phase detector 430 further includes a delay buffer DBUF1 coupled to the output terminal of the switch unit TR1 and a delay buffer DBUF2 coupled to the output terminal of the switch unit TR2. Meanwhile, the stopping signal SP is delayed by the above-mentioned delay time plus the gate delay $T_{d1}$ caused by the above-mentioned delay buffer DBUF1. The starting signal ST is similarly delayed to the delay time of the stopping signal SP. In addition, the starting signal ST is delayed by another time, that is, the gate delay $T_{d1}$ caused by the delay buffer DBUF2. It can be seen from FIG. 5, the phase difference $T_C$ between the starting signal ST and the stopping signal SP is just equal to the undetected time of the pulse input signal Input. Therefore, the undetected portion of the pulse input signal Input can be represented by means of the starting signal ST and the stopping signal SP.

Note that in order to make the detection result of the multi-phase detector 430 more accurate, the multi-phase detector 430 further includes a delay matching circuit 570 coupled to the second output terminal of the phase mixer 520 so as to enable the first output pulse signal In and the second output pulse signal Inb of the phase mixer 520 have a same load, which is beneficial to balance the two delays caused by the loads. In addition, the multi-phase detector 430 further includes a plurality of buffers BUF1 (in the embodiment, 16 buffers in total), which are respectively coupled between the output terminal of the first delay chain 530 and the clock signal input terminal of the corresponding register DFF1.

Figure 6A:
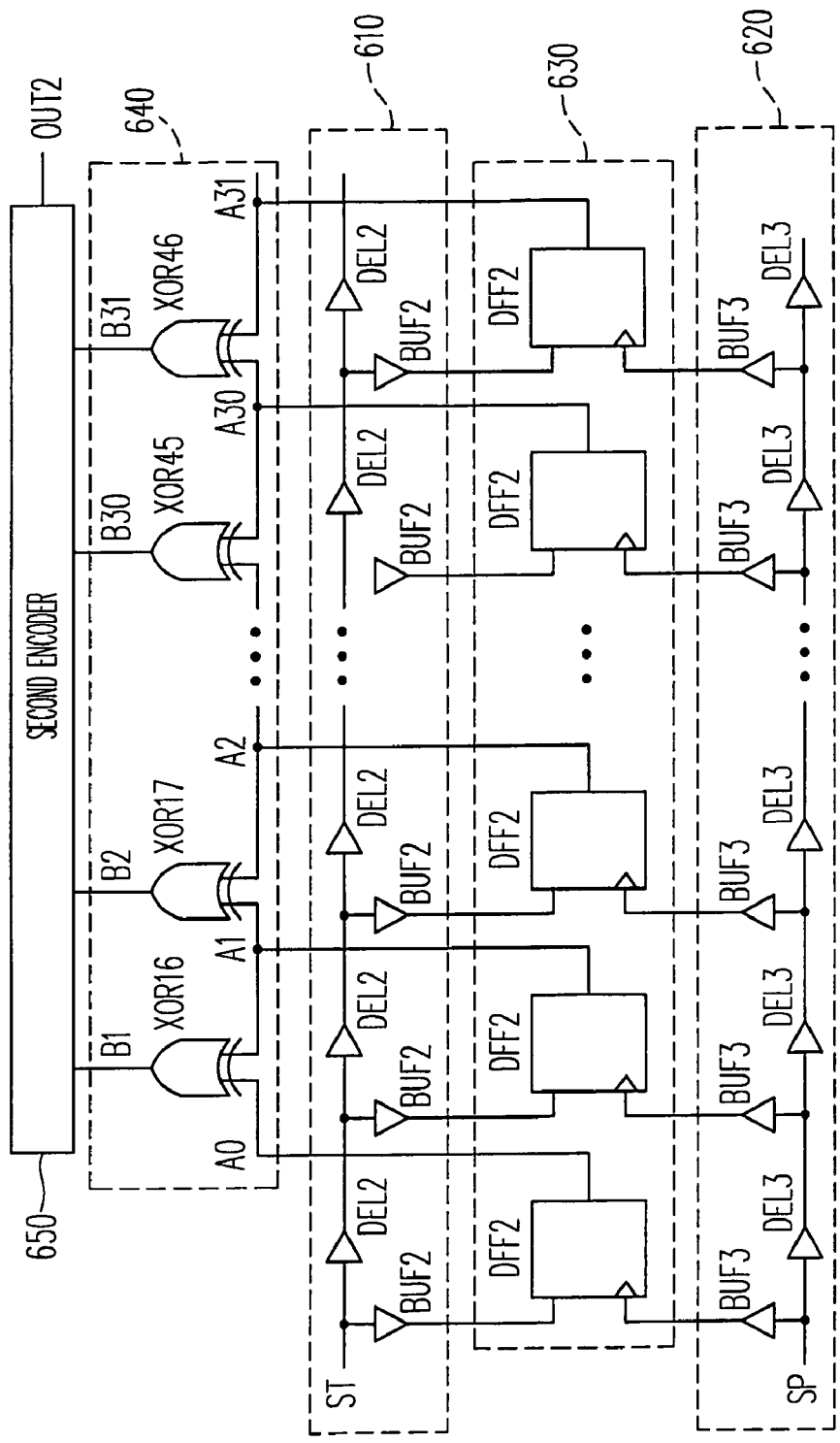
FIG. 6A is an implementation of a Vernier detector according to an embodiment of the present invention.

FIG. 6A is an implementation of a Vernier detector according to an embodiment of the present invention. Referring to FIG. 6A, the Vernier detector 440 includes a second delay chain 610, a third delay chain 630, a second register module 630, a second comparison module 640 and a second encoder 650. The input terminal of the second delay chain 610 receives the starting signal ST and the second delay chain 610 includes a plurality of delay components DEL2 connected in series (in the embodiment 33 delay components in total). The delay components DEL2 sequentially delay the starting signal ST and thereby produce 32 pieces of the second delay outputs, wherein the last delay component is out of duty since no following delay component DEL2 serves as a load). The input terminal of the third delay chain 620 receives the stopping signal SP and the third delay chain 620 includes a plurality of delay components DEL3 connected in series (in the embodiment 33 delay components in total). The delay components DEL3 sequentially delay the stopping signal SP and thereby produce 32 pieces of the third delay outputs, wherein the last delay component is out of duty since no following delay component DEL3 serves as a load).

The second register module 630 includes a plurality of registers DFF2 (in the embodiment, 32 registers in total), the clock signal input terminal of each register DFF2 sequentially receives the third delay output and the data input terminal of each register DFF2 sequentially receives the second delay output. The output terminals of the registers DFF2 produce 32 sampling results A0-A31 coupled to the second comparison module 640. The second comparison module 640 includes a plurality of comparators XOR16-XOR46 (in the embodiment, 31 comparators in total and they are implemented by MUTEX-OR gates). The input terminals of the comparators XOR16-XOR46 sequentially receive two results among the sampling results A0-A31. For example, the input terminal of the comparator XOR16 receives the sampling results A0 and A1, the input terminal of the comparator XOR17 receives the sampling results A1 and A2, and analogically for the rest. The output terminals of the comparators XOR16-XOR46 sequentially produce comparison results B1-B31. Besides, the second encoder 650 receives the comparison results B1-B31 and codes them into a digital output signal OUT2.

FIG. 6B is a diagram illustrating the input signals and the output signals of the Vernier detector in FIG. 6A. In terms of the operation of the Vernier detector 440 referring to FIG. 6B, the delay component DEL2 herein produces a delay value $T_f$ according to counting signal C1 and the delay component DEL3 produces the delay value $T_d$ according to the counting signal C3. Since the counting signal C3 is the difference between the counting signal C1 and the counting signal C2, thus, the delay value $T_f$ is greater than the delay value $T_d$; and since the delay value $T_f$ is greater than the delay value $T_d$, the second delay outputs DEL2_1-DEL2_32 produced according to the starting signal ST would be closed to even ahead of the third delay outputs DEL3_1-DEL3_32 produced according to the stopping signal SP with the increased delay stage. In the implementation of FIG. 5, prior to any delaying, the starting signal ST is ahead of the stopping signal SP by a phase difference $T_C$ already; after being delayed by the first stage, the second delay output DEL2_1 is ahead of the third delay output DEL3_1 by a phase difference of $T_C$-$\Delta T$, wherein $\Delta T$ is equal to the difference between the delay value $T_f$ and the delay value $T_d$ and analogically for the rest. After five delaying, the third delay output DEL3_1 is ahead of the second delay output DEL2_5.

As the second delay output DEL2_1 is ahead of the third delay output DEL3_1, the sampling result A0 produced by the corresponding register DFF2 is equal to '1'; as the second delay output DEL2_5 is behind the third delay output DEL3_5, the sampling result produced by the register DFF2 is equal to '0'. Thus, the phase difference $T_C$ can be obtained by a transition point where the sampling result A4 equal to '1' is transited to the sampling result A5 equal to '0'. The second comparison module 640 is in charge of determining the transition point from '1' to '0' among the received sampling results A0-A31 by comparison and sending the comparison results B1-B31 to the second encoder 650 so as to convert the comparison results B1-B31 into digital codes, followed by outputting the digital codes as the output signal OUT2. In addition, the Vernier detector further includes a plurality of buffers BUF2 and a plurality of buffers BUF3, wherein the buffers BUF2 are coupled between the output terminals of the second delay chain 610 and the data input terminal of the registers DFF2. The buffers BUF3 are coupled between the output terminals of the third delay chain 620 and the registers DFF2.

Figure 7A:
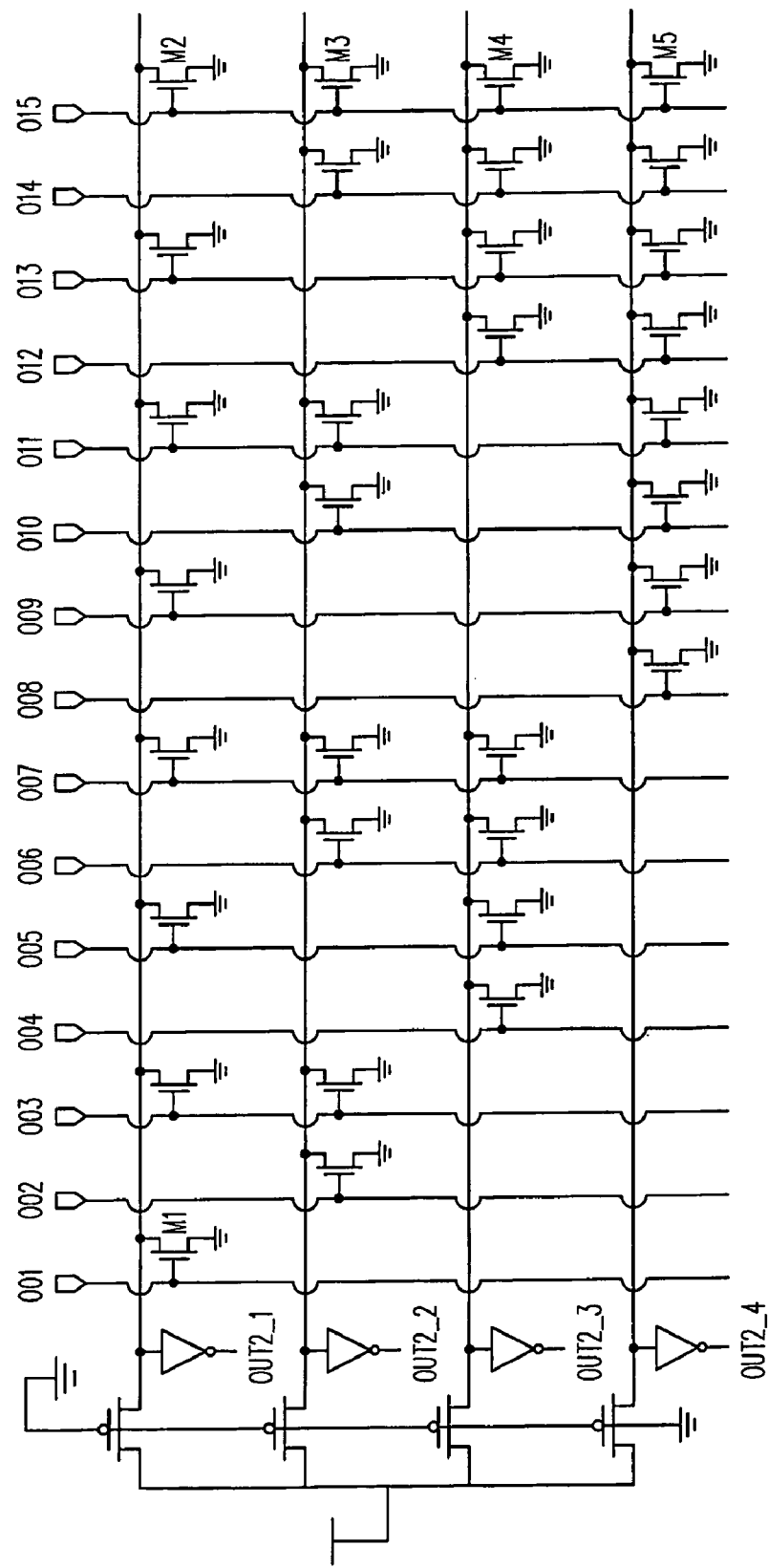
FIG. 7A is a diagram showing an implementation of a coder according to an embodiment of the present invention.
Figure 7B:
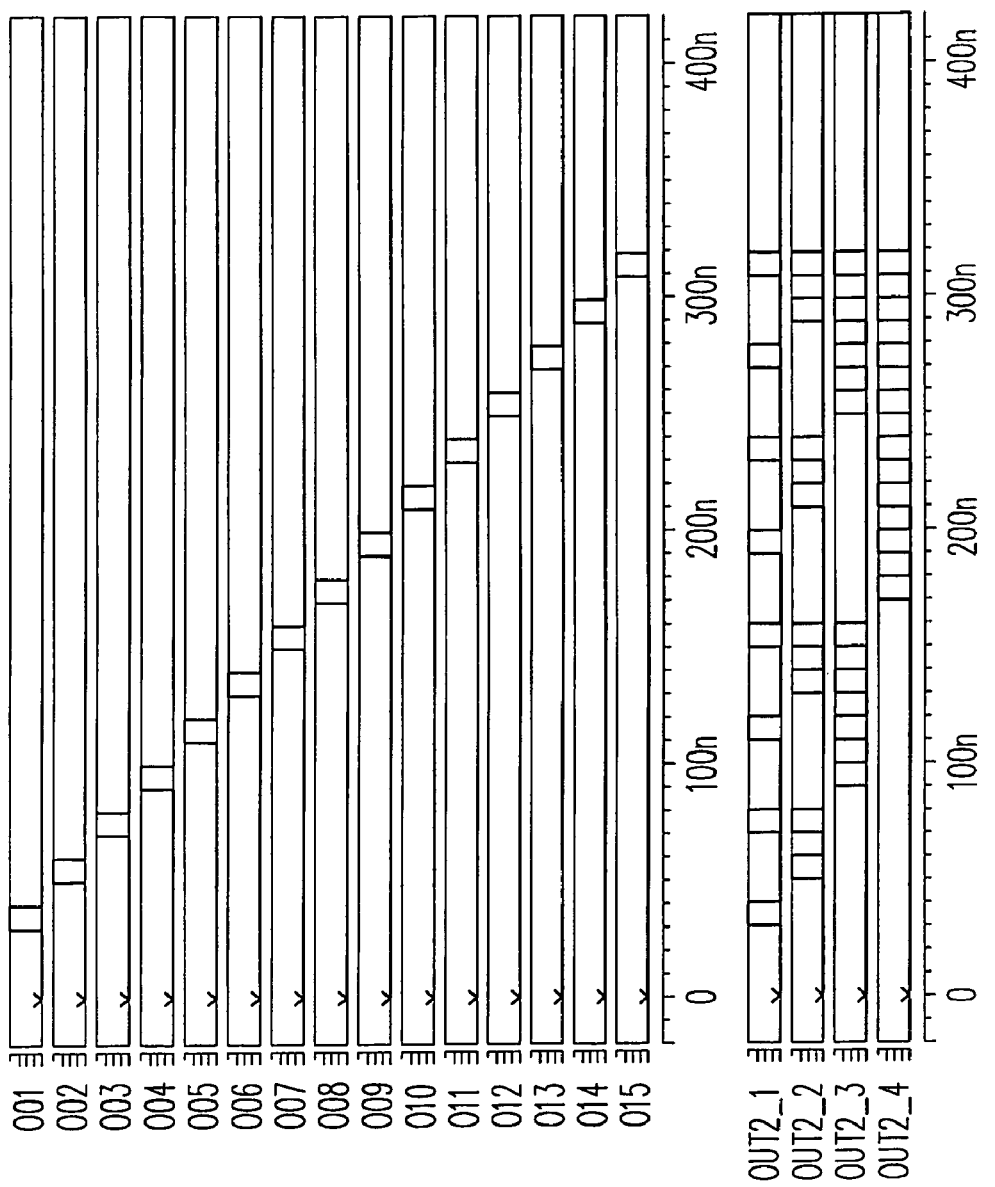
FIG. 7B is a diagram illustrating the input signals and the output signals of the coder in FIG. 7A.

FIG. 7A is a diagram showing an implementation of a coder according to an embodiment of the present invention. Referring to FIG. 7A, the implementation of FIG. 7A is suitable for the first encoder 510 and the second encoder 650 of the above-mentioned embodiment. The coder herein is the most simple coding circuit for coding a plurality of input signals into binary codes. In the embodiment, there are 16 input signals O01-O16 in total, and 4 output signals OUT2_1-OUT2_4 are required. FIG. 7B is a diagram illustrating the input signals and the output signals of the coder in FIG. 7A. When the input signal O01 takes high-level, the corresponding N-type transistor M1 is turned on, which makes the output signals OUT2_1-OUT2_4 of '0001' sequentially output. Similarly, when the input signal O15 takes high-level, the corresponding N-type transistors M2-M5 are turned on and the output signals OUT2_1-OUT2_4 of '1111' are sequentially output. Note that only one of the input signals O01-O16 takes high-level at a same time, which is the condition for the implementation.

Figure 8A:
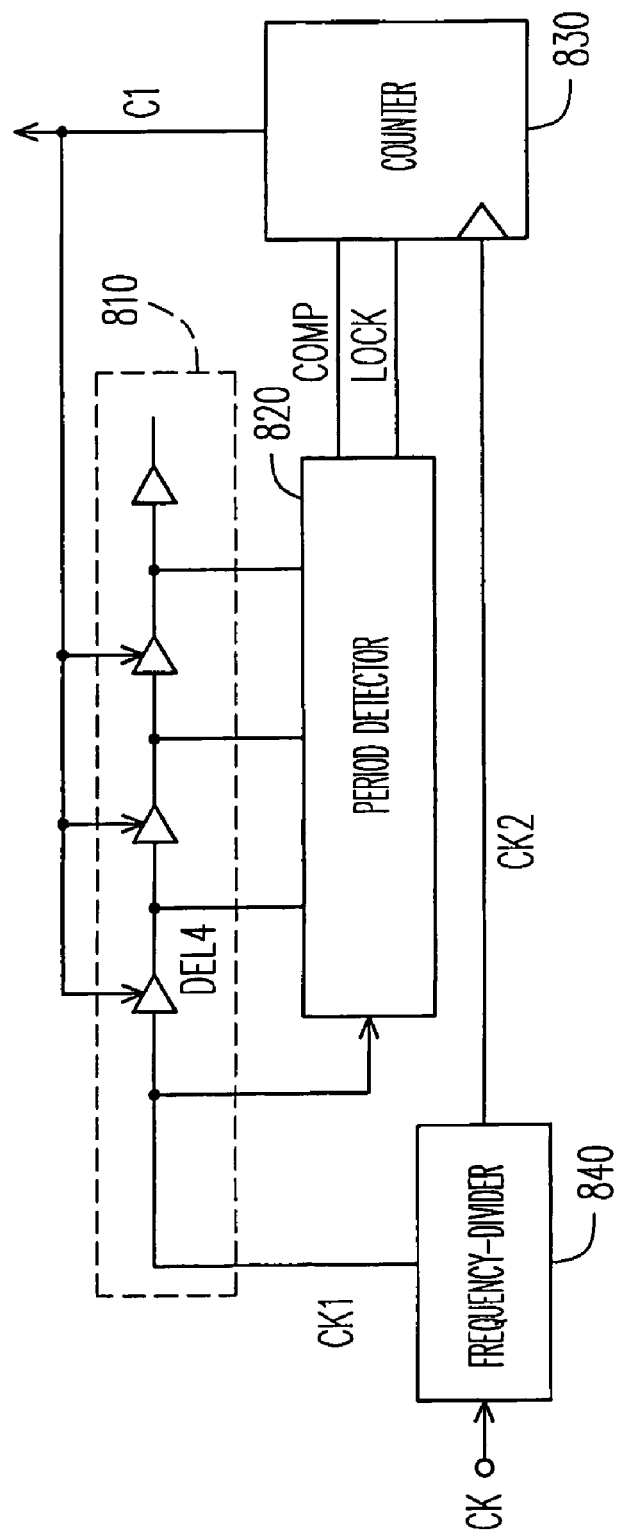
FIG. 8A is a diagram showing an implementation of a delay phase-locked loop according to an embodiment of the present invention.

FIG. 8A is a diagram showing an implementation of a delay phase-locked loop according to an embodiment of the present invention. Referring to FIG. 8A, the DPLL 410 includes a fourth delay chain 810, a period detector 820 and a counter 830. The DPLL 410 further includes a frequency-divider 840. The input terminal of the fourth delay chain 810 receives the clock signal CK1 and the fourth delay chain 810 includes a plurality of delay components DEL4 connected in series to each other. The output terminals of the delay components DEL4 produce a plurality of fourth delay signals. The clock signal input terminal of the period detector 820 receives the clock signal CK1 and the signal input terminals thereof receive the above-mentioned fourth delay signals. In addition, the lock signal output terminal of the period detector 820 outputs a locking signal LOCK and the comparison signal output terminal thereof outputs a comparison signal COMP. The input terminal of the counter 830 receives the clock signal CK2, the enabling terminal thereof is coupled to the locking signal output terminal of the period detector 820, the direction terminal thereof is coupled to the comparison signal output terminal of the period detector 820 and the output terminal thereof outputs a counting signal C1. Besides, the frequency-divider 840 receives a clock signal CK, conducts frequency-dividing and respectively produces the clock signals CK1 and CK2.

Figure 8B:
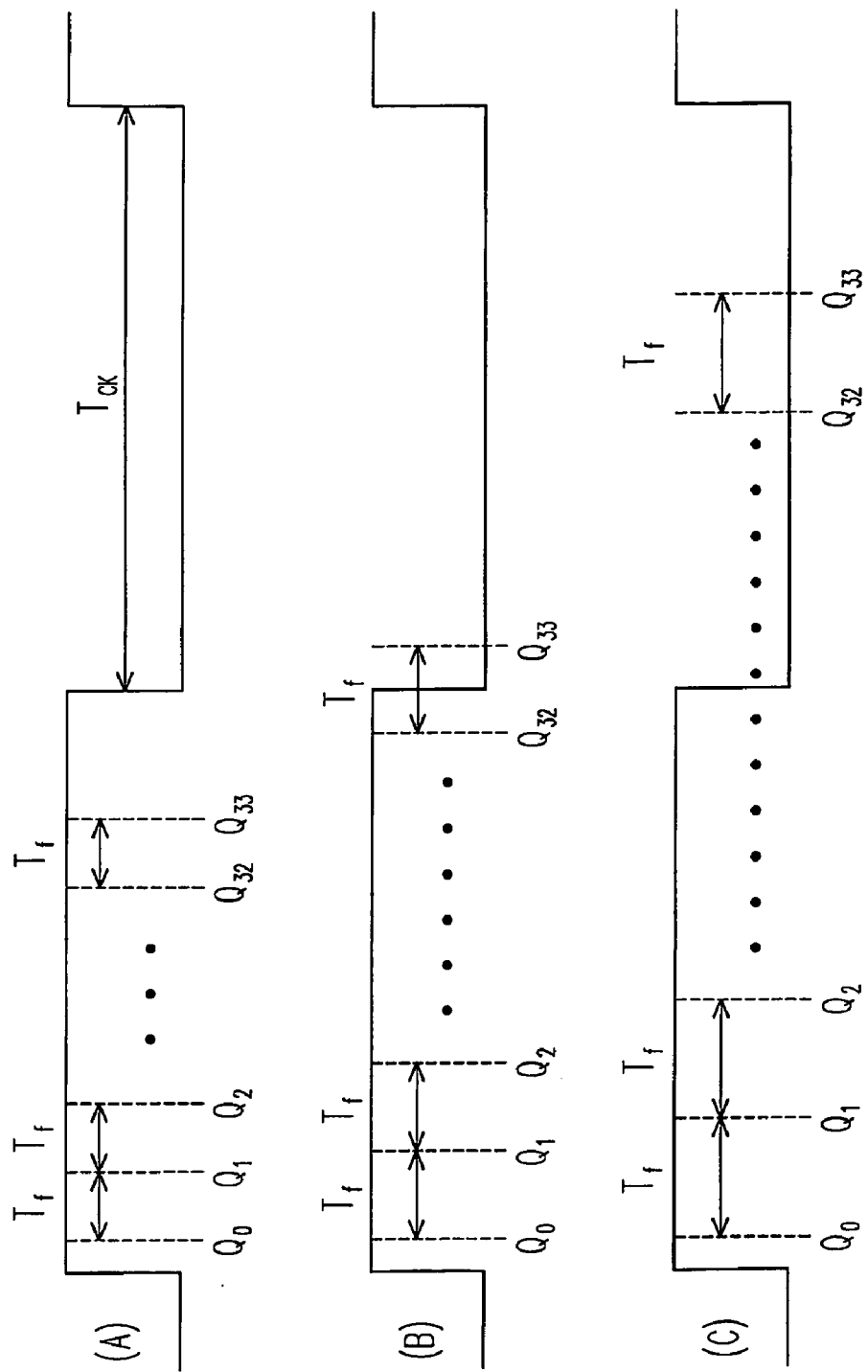
FIG. 8B is a diagram illustrating the input signals and the output signals of the delay phase-locked loop in FIG. 8A.

The operation of the DPLL 410 may be described with reference to FIG. 8B. FIG. 8B is a diagram illustrating the input signals and the output signals of the delay phase-locked loop in FIG. 8A. In the embodiment, the input clock signal CK1 with a period $T_{ck}$ is evenly divided into 32 portions. Accordingly, the fourth delay chain 810 includes 33 delay components DEL4. When the clock signal CK1 is input to the DPLL 410, the frequency-divider 840 conducts frequency-dividing on the input clock signal CK so as to obtain two clock signals CK2 and CK4, which makes both the positive pulse-width and the negative pulse-width of the clock signal CK2 equal to $T_{ck}$.

Next, the clock signal CK2 is sent to the frequency-divider 840. As shown by FIG. 8B (A), when the clock signal CK2 passes through each stage of the delay components DEL4, the clock signal CK2 is detected by the DPLL 410 once and the detection results Q0~Q33 are produced (the detection result Q0 herein is the detection result on the clock signal CK2 not delayed yet). The delay time of every delay component DEL4 is $T_f$, and the delay value $T_f$ in the embodiment is proportional to the counting signal C1. If the phases of the fourth delay signals in total of 33 signals are required to be ahead of the negative edge of the clock signal CK2, then, all the detection results Q0-Q33 must be '1' as shown by FIG. 8B (B). At this time, the counter starts upwards counting on the clock signal CK4 so as to increase the desired delay time $T_f$. In contrast, if one or more than one of the 33 phases of the fourth delay signals produced by the delay components DEL4 is behind the negative edge of the clock signal CK2, then, not all the detection results Q0-Q33 are '1', as shown by FIG. 8B (C). Meanwhile, the counter starts downwards counting on the clock signal CK4 so as to decrease the desired delay time $T_f$.

It can be seen from the above-described that the DPLL 410 adjusts the counting signal C1 to mutually adjust the delay time $T_f$ and the clock signal CK2 so as to lock the delayed phase, and the counting result output from the counter is used to convert the time to be measured into the digital value.

Figure 9A:
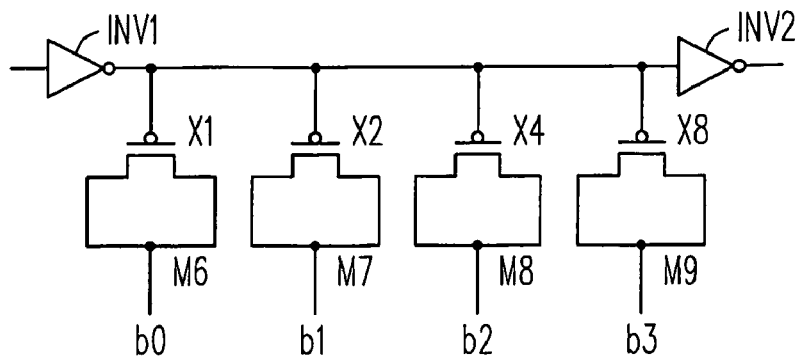
FIG. 9A is a diagram showing an implementation of delay component s according to an embodiment of the present invention.

FIG. 9A is a diagram showing an implementation of delay component s according to an embodiment of the present invention. Referring to FIG. 9A, the delay components herein are implemented by digital circuits, wherein the transistors M6-M9 are coupled to work in capacitor mode, and the dimensions of the transistors M6, M7, M8 and M9 are proportional in 1:2:4:8. The selection signals b0~b3 of the delay components are a set of binary codes to select several capacitors for use. A larger total dimension summation of the selected capacitors means the delay time between a NOT-gate INV1 and a NOT-gate INV2 is longer, i.e., the selected delay components are capable of causing a larger delay value; in contrast, a smaller total dimension summation of the selected capacitors means the selected capacitors cause a smaller delay value.

For example, the value of the selection signals b0~b3 are specified as a binary number of 1100, which means the transistors M6 and M9 are effective capacitors and the caused delay thereof is three times of the delay caused by the single transistor M6. In a real circuit process, the transistor M7 can be implemented by two transistors M6 connected in parallel, so that the possible error caused by the process can be effectively reduced, which makes the delay caused by the delay components more stable.

Figure 9B:
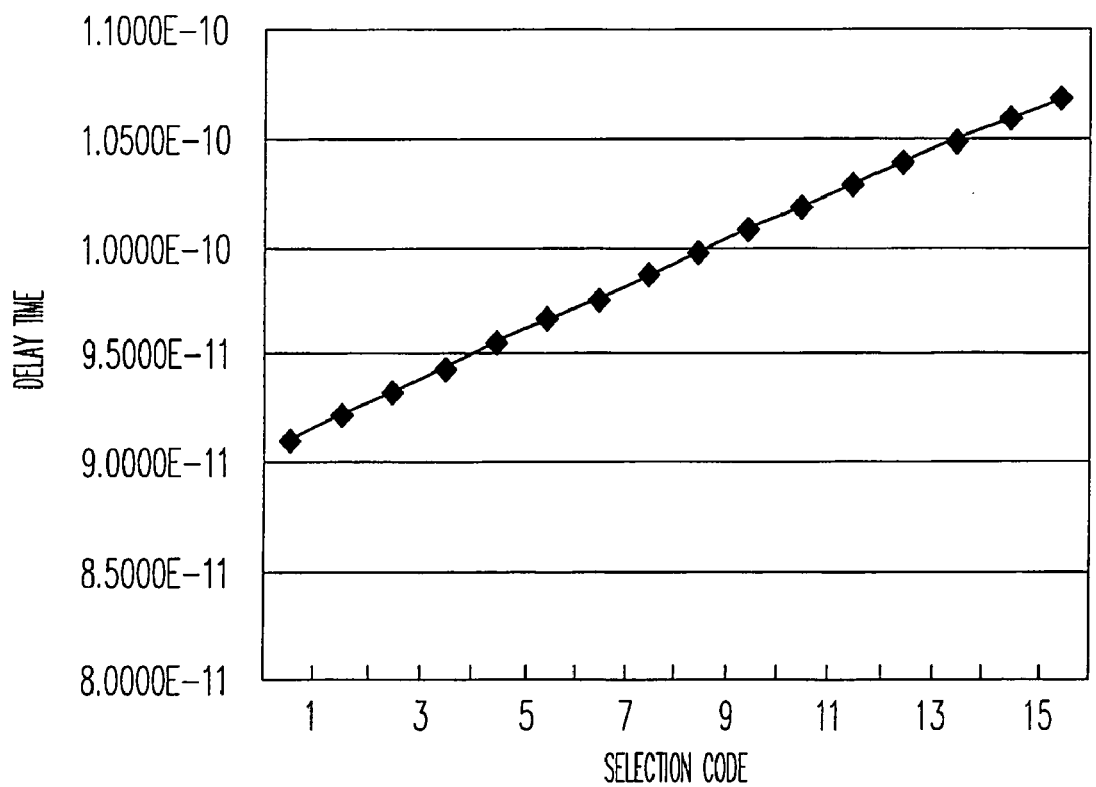
FIG. 9B is a graph showing the relationship of the delay time vs. the selection code of the delay components in FIG. 9A.

FIG. 9B is a graph showing the relationship of the delay time vs. the selection code of the delay components in FIG. 9A, where it is clear that the delay linearity produced by the selection codes and the corresponding delay components is reliable so as to provide the accurate delay signals.

In summary, the present invention utilizes digital delay components in association with a 2-stage detection circuit for accurately measuring a high-speed pulse signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A time-to-digital converter apparatus, comprising:
a delay phase-locked loop, having an input terminal and an output terminal, wherein the input terminal receives an input clock signal and the output terminal transmits a first counting signal;
a subtracter, having an output terminal, a first input terminal and a second input terminal, wherein the first input terminal receives the first counting signal, the second input terminal receives a second counting signal, the output terminal produces a third counting signal and the third counting signal is equal to the difference between the first counting signal and the second counting signal;
a multi-phase detector, coupled to the delay phase-locked loop to receive the first counting signal; and
a Vernier detector, coupled to the delay phase-locked loop, the subtracter and the multi-phase detector, the Vernier detector receives the first and the third counting signals and a plurality of outputs of the multi-phase detector, the Vernier detector generates a digital output signal according to the first and the third counting signals and the outputs of the multi-phase detector.

2. The time-to-digital converter apparatus according to claim 1, wherein the delay phase-locked loop comprises O pieces of the first delay components, wherein O is a positive integer, and wherein the first delay components are composed of digital circuits and the delay phase-locked loop controls the first delay components according to the first counting signal so that the delays produced by the first delay components are a first delay value and the period of the input clock signal is O times of the first delay value.

3. The time-to-digital converter apparatus according to claim 1, wherein the multi-phase detector comprises P pieces of second delay components, P is a positive integer, the second delay components are composed of digital circuits and the multi-phase detector has a pulse signal input terminal, a time signal input terminal, a starting signal input terminal, a stopping signal output terminal and an output terminal, wherein the pulse signal input terminal receives a pulse input signal, the time signal input terminal receives a first counting signal, and the multi-phase detector controls the second delay components according to the first counting signal so as to make the delays produced by the second delay components equal to a second delay value, wherein the pulse-width of the pulse input signal is between N times and (N+1) times of the second delay value, wherein N is a positive integer, N+1 is less than or equal to P, the starting signal output terminal produces a starting signal and the stopping signal output terminal produces a stopping signal, and wherein the phase difference between the starting signal and the stopping signal is equal to the difference between the pulse-width of the pulse input signal and N times of the second delay value, and the output terminal of the multi-phase detector outputs a first output signal.

4. The time-to-digital converter apparatus according to claim 3, wherein the Vernier detector comprises (2×Q) pieces of third delay components and Q is a positive integer, wherein the third delay components are composed of digital circuits, the Vernier detector has a starting signal input terminal, a stopping signal input terminal, the first counting signal input terminal, a second counting signal input terminal and an output terminal, wherein the starting signal input terminal receives the starting signal, the stopping signal input terminal receives the stopping signal, the first counting signal input terminal receives the first counting signal, the second counting signal input terminal receives the third counting signal, the Vernier detector controls a first portion of the third delay components according to the first counting signal so that the delays produced by the first portion are a third delay value, the Vernier detector controls a second portion of the third delay components according to the third counting signal so that the delays produced by the second portion are a fourth delay value and the phase difference between the starting signal and the stopping signal is between M times and (M+1) times of the difference between the third delay value and the fourth delay value, wherein M is a positive integer and M+1 is less than or equal to Q, and the output terminal of the Vernier detector outputs a second output signal according to M.

5. The time-to-digital converter apparatus according to claim 3, wherein the first output signal is the high-bit set of the digital conversion result of the pulse-width of the pulse input signal, and the second output signal is the low-bit set of the digital conversion result of the pulse-width of the pulse input signal.

6. The time-to-digital converter apparatus according to claim 3, wherein the multi-phase detector comprises:
- a phase mixer, having an input terminal, a first output terminal and a second output terminal, wherein the input terminal receives the pulse input signal and adjusts the phase of the pulse input signal, the first output terminal outputs a first output pulse signal and the second output terminal outputs a second output pulse signal, wherein the first output pulse signal is phase-inverted to the second output pulse signal;
- a first delay chain, having an input terminal and a plurality of output terminals, wherein the input terminal is coupled to the first output pulse signal, the first delay chain comprises P pieces of the second delay components connected in series to each other and the second delay components sequentially delay the first output pulse signal so as to produce P pieces of first delay outputs and the output terminals of the first delay chain respectively output P pieces of the first delay outputs;
- a first register module, comprising P pieces of first registers, wherein each first register has a data input terminal, a clock signal input terminal and an output terminal, wherein the data input terminals of the first registers commonly receive the first output pulse signal, the clock signal input terminal of each of the first registers respectively and sequentially receives the first delay outputs for sampling the first output pulse signal and the output terminal of each of the first register outputs P pieces of first sampling results;
- a first comparison module, comprising (P−1) pieces of first comparators, wherein each of the first comparators is for sequentially comparing two results among the first sampling results, each of the first comparators has an output terminal, the first comparators produce (P−1) pieces of first comparison results at the output terminals thereof by comparing the first comparison results;
- a first encoder, having an input terminal and an output terminal, wherein the input terminal receives the first comparison results, the first encoder conducts coding on the received results to obtain the first output signal for outputting at the output terminal thereof;
- a first switch module, comprising (P−1) pieces of first switch units, wherein each of the first switch units has an input terminal, an output terminal and an enabling terminal, wherein the enabling terminal is respectively coupled to the output terminal of each of the first comparators, the input terminal is respectively coupled to the output terminal of each of the second delay components and the output terminals of the first switch units are commonly coupled to each other and output the stopping signal; and
- a second switch unit, having an input terminal, an output terminal and an enabling terminal, wherein the enabling terminal is coupled to a first voltage, the first voltage is for permanently enabling the second switch unit, the input terminal receives the second output pulse signal and the output terminal is for outputting the starting signal, wherein the second switch unit and each of the first switch units has a same circuit structure.

7. The time-to-digital converter apparatus according to claim 6, wherein the multi-phase detector further comprises:
- a first delay buffer, having an input terminal and an output terminal, wherein the input terminal is coupled to the output terminal of the first switch units and the output terminal outputs the stopping signal; and
- a second delay buffer, having an input terminal and an output terminal, wherein the input terminal is coupled to the output terminal of the second switch units and the output terminal outputs the starting signal and the first delay buffer and the second delay buffer have a same circuit structure.

8. The time-to-digital converter apparatus according to claim 6, wherein the multi-phase detector further comprises P pieces of first buffers respectively coupled between the output terminal of the first delay chain and the clock signal input terminals of the first registers.

9. The time-to-digital converter apparatus according to claim 6, wherein the multi-phase detector further comprises a delay matching circuit coupled to the second output terminal of the phase mixer so as to make the first output pulse signal and the second output pulse signal have same load.

10. The time-to-digital converter apparatus according to claim 4, wherein the Vernier detector comprises:
- a second delay chain, having an input terminal and an output terminal, wherein the input terminal receives the starting signal, the second delay chain comprises Q pieces of third delay components connected in series to each other and the third delay components produce the third delay value according to the first counting signal and sequentially delay the starting signal so as to produce Q pieces of second delay outputs sent to the output terminal of the second delay chain, wherein Q is a positive integer;
- a third delay chain, having an input terminal and an output terminal, wherein the input terminal receives the stopping signal, the third delay chain comprises Q pieces of fourth delay components connected in series to each other, wherein the fourth delay components produce the fourth delay value according to the third counting signal and sequentially delay the stopping signal so as to produce Q pieces of third delay outputs sent to the output terminal of the third delay chain;
- a second register module, comprising Q pieces of second registers, wherein each of the second registers has a data input terminal, a clock signal input terminal and an output terminal, wherein the data input terminals of the second registers respectively and sequentially receive the second delay outputs, the clock signal input terminals of the second registers respectively and sequentially receive the third delay outputs and the second register module are for sampling the second delay outputs by using the third delay outputs and the output terminal thereof outputs Q pieces of second sampling results;
- a second comparison module, comprising (Q−1) pieces of second comparators, wherein each of the second comparators is for sequentially comparing two results among the second sampling results, each of the second comparators has an output terminal, the second comparators produce (Q−1) pieces of second comparison results at the output terminals thereof by comparing the second comparison results; and
- a second encoder, having an input terminal and an output terminal, wherein the input terminal receives the second comparison results, the second encoder conducts coding on the received results to obtain the second output signal for outputting at the output terminal thereof.

11. The time-to-digital converter apparatus according to claim 10, wherein the Vernier detector further comprises:
- Q pieces of second buffers, coupled between the output terminal of the second delay chain and the data input terminals of the second registers, wherein Q is a positive integer; and Q pieces of third buffers, coupled between the output terminal of the third delay chain and the clock signal input terminals of the second registers.

12. The time-to-digital converter apparatus according to claim 2, wherein the delay phase-locked loop comprises:
   a fourth delay chain, having an input terminal and an output terminal, wherein the input terminal receives the input clock signal, the fourth delay chain comprises (Q+1) pieces of first delay components connected in series to each other, wherein the first delay components produce the first delay value according to the first counting signal and sequentially delay the input clock signal so as to produce (Q+1) pieces of fourth delay signals at the output terminal thereof;
   a period detector, having a signal input terminal, a clock signal input terminal, a comparison signal output terminal and a locking signal output terminal, wherein the clock signal input terminal receives the input clock signal, the signal input terminal receives the fourth delay signals, the locking signal output terminal outputs a locking signal and the comparison signal output terminal outputs a comparison signal; and
   a counter, having a clock signal input terminal, an enabling terminal, a direction terminal and an output terminal, wherein the clock signal input terminal receives the input clock signal, the enabling terminal is coupled to the locking signal output terminal of the period detector, the direction terminal is coupled to the comparison signal output terminal of the period detector and the output terminal outputs the first counting signal,
   wherein the period detector is for detecting the fourth delay signals and comparing the delay time of each of the fourth delay signals with the period of the input clock signal so as to disable or enable the locking signal and thereby to stop or start the counting operation of the counter for adjusting the fourth delay signals.

13. The time-to-digital converter apparatus according to claim 12, wherein the delay phase-locked loop further comprises:
   a frequency-divider, having an input terminal, a first output terminal and a second output terminal, wherein the input terminal receives the input clock signal, the first output terminal is coupled to the fourth delay chain, the period detector and the second output terminal is coupled to the counter and the frequency-divider conducts frequency-dividing on the input clock signal and produces a first clock signal at the first output terminal thereof and produces a second clock signal at the second output terminal thereof.

14. The time-to-digital converter apparatus according to claim 3, further comprising a pulse generator coupled between the pulse input signal and the multi-phase detector, wherein the pulse generator has an input terminal, an output terminal and an enabling terminal, wherein the input terminal receives the pulse input signal, the enabling terminal receives an enabling signal, and when the enabling signal is enabled, the output terminal outputs the pulse input signal; when the enabling signal is disabled, the output terminal thereof outputs a ground voltage.

* * * * *